March 3, 1959 D. V. GEPPERT 2,876,184

TRANSISTOR PROCESS AND APPARATUS

Filed June 2, 1954 3 Sheets-Sheet 1

INVENTOR.

Donovan V. Geppert,

BY

Mueller & Aichele

Attys.

March 3, 1959 D. V. GEPPERT 2,876,184

TRANSISTOR PROCESS AND APPARATUS

Filed June 2, 1954 3 Sheets-Sheet 2

INVENTOR.
Donovan V. Geppert,
BY
Mueller & Aichele
Attys.

March 3, 1959 D. V. GEPPERT 2,876,184

TRANSISTOR PROCESS AND APPARATUS

Filed June 2, 1954 3 Sheets-Sheet 3

INVENTOR.
Donovan V. Geppert,
BY
Mueller & Aichele
Atty's.

United States Patent Office 2,876,184

Patented Mar. 3, 1959

2,876,184

TRANSISTOR PROCESS AND APPARATUS

Donovan V. Geppert, Phoenix, Ariz., assignor to Motorola, Inc., Chicago, Ill., a corporation of Illinois Application June 2, 1954, Serial No. 433,873

21 Claims. (Cl. 204—143)

The present invention relates to transistors, and more particularly to an improved process and apparatus for fabricating a transistor of the type presently referred to in the art as a "surface barrier" transistor.

Several types of transistors are presently known to the art. The earlier types contain at least two forms of germanium or other semiconductor crystal material. For example, the point-contact transistor contains a semi-conductor crystal of one form with modified regions of another form adjacent the points of the cat whisker emitter and collector electrodes. The earlier junction type transistor also includes a single semiconductor crystal of two different forms of crystal material exhibiting n-p-n or p-n-p characteristics. The more recent alloy junction transistor, usually formed by alloying an impurity metal such as indium on opposite faces of an n-type semiconductor crystal wafer, contains p-type recrystallized areas adjacent the alloyed metal electrodes with respective p-n junctions within the crystal, so that this type also contrains two forms of crystal material. A recently discovered type of transistor referred to in the art as a "surface barrier" transistor, differs from the previous types in that it contains only one form of semiconductor crystal material and has p-n junctions formed on its opposite surfaces rather than internally. In the latter type, the interfaces of the transistor that form the p-n junctions and perform the functions of emission and collection of the useful currents are located on the surface of a uniform semiconductor crystal wafer such as germanium. The latter construction permits accurate control of the geometry of the crystal and provides improved performance characteristics. That is, a properly constructed surface barrier transistor is capable of efficient operation and high power gain at frequencies greatly in excess of the capabilities of the prior types discussed above having internal p-n junctions.

Briefly, surface barrier transistors are formed by etching craters or cavities in opposite faces of a semiconductor crystal wafer, so that the thickness of the wafer between the cavities is reduced, for example, to the order of about 0.0002". A metal is then electroplated in each of the craters to form the emitter and collector electrodes. It is usual to use an n-type germanium wafer and electroplate indium into the craters; however, zinc, cadmium, tin and other materials can also be used.

The etching and electroplating is usually carried out by means of an electrolytic jet which is usually a salt solution of the metal to be electroplated. A current is passed through the jet and the semiconductor in one direction to effectuate etching and the current is reversed to cause electroplating to take place. For example, the jet may contain indium salts (such as indium sulphate or indium chloride), and when the current is in the etching direction, the two sides of the crystal wafer are etched to form cavities with a wall or barrier of semiconductor of a desired thickness therebetween. When the desired thickness of the barrier is reached, the current is reversed and indium electrodes are plated in the cavities to form the emitter and collector electrodes. A 0.1 normal solution of low pH has been found suitable for the jet, with a jet pressure of 15 p. s. i. It is to be noted that the current flow during the etching step is in the "back" direction of the p-n junction formed between the pet and the semiconductor. This current flow is saturation current augmented by the effect of light which produces pairs of carriers in the barrier region. Therefore, high ambient light is desirable during the etching step.

It is essential for high power gain and for satisfactory high frequency operation, that the p-n junctions of a transistor be as close to one another as possible. It is, therefore, necessary that accurate and precise control be exercised over the etching process to insure that an extremely thin layer or wall of the semiconductor crystal material exists between the bottoms of the etched cavities to assure physical closeness of the junctions formed at the bottom of these cavities.

It is also essential that junctions and, therefore, the electroplated emitter and collector electrodes, be parallel with one another for efficient high frequency operation. This presents a problem in the usual jet-etch process due to the tendency for the cavities to have dish-shaped or concave bottom surfaces. Unless steps are taken, the subsequent electroplating fills the cavity so that the facing surfaces of the emitter and collector electrodes are not parallel. It has been attempted after the electroplating step to etch the electrodes so as to reduce their diameter and confine them to the bottom part of the dish-shaped cavities, but this etching is extremely difficult to carry out as utmost care must be taken that it does not completely destroy the plated electrodes. Moreover, it is essential that the electrodes be directly opposite one another, and desirable that the collector be somewhat larger than the emitter, and this is difficult to control when etching is resorted to.

An object of the invention is to provide an improved process in which opposing cavities are etched in the opposite surfaces of a semiconductor wafer and by which the etching can be terminated when such cavities are separated by an extremely thin barrier or wall of semiconductor material.

Another object of the invention is to provide such an improved process which may be carried out rapidly and efficiently, and by apparatus that uses readily available and relatively uncomplicated components.

A further object of the invention is to provide such an improved process and apparatus, by which the cavities are formed with essentially flat bottoms and in which metal electrodes are electroplated at the central, flattest portion of the bottoms to be essentially parallel with one another for improved performance in the resulting transistor.

A feature of the invention is the provision of an improved process for fabricating a surface barrier transistor in which an electrolytic etching jet is directed to at least one surface of a semiconductor crystal wafer with a current being passed through the jet and the wafer to effect the etching process, and in which the current through the jet is controlled in synchronism with a mechanical shifting of the crystal so that an etched cavity may be formed to a selected depth at one position on the surface of the crystal at the precise moment breakthrough occurs at another position.

Another feature of the invention is the provision of such an improved process in which the semiconductor crystal wafer is given further mechanical movements during the etching step so that the etching jet effectively scans a portion of the surface of the wafer to form an etched cavity having a relatively flat and uniform bottom surface with larger radial dimensions than cavities formed without such scanning, and in which the scanning is terminated at the end of the etching step and the current is reversed with the jet being directed at the center of the cavity so that an electroplated electrode may be disposed only on the flat bottom surface of the cavity, as is desired, and does not completely fill the cavity and extend up the sides thereof.

The above and other features of the invention which are believed to be new are set forth with particularity in the appended claims, the invention itself, however, together with further objects and advantages thereof may best be understood by reference to the accompanying drawings in which:

In practicing the invention, an electrolytic jet is directed onto a surface of a semiconductor wafer, and an electric current is passed through the jet and the wafer to establish an etching action by the jet on the surface of the wafer. The electric current is modulated to control the speed of the etching action, and the relative position of the jet and the wafer is periodically varied in synchronism with the modulation of the electric current. This establishes the etching action at two distinct positions on the surface of the wafer, and at different speeds at each position. In this manner, the etch-through at the high speed position can be used as an indication of desired depth of the etched cavities at the low speed position.

In accordance with another aspect of the invention, the electrolytic jet is effectively made to scan each position in such a manner as to develop flat-bottomed cavities which have a larger radial dimension than those produced merely by directly the jet onto the surface without such scanning.

Figures 1, 2:
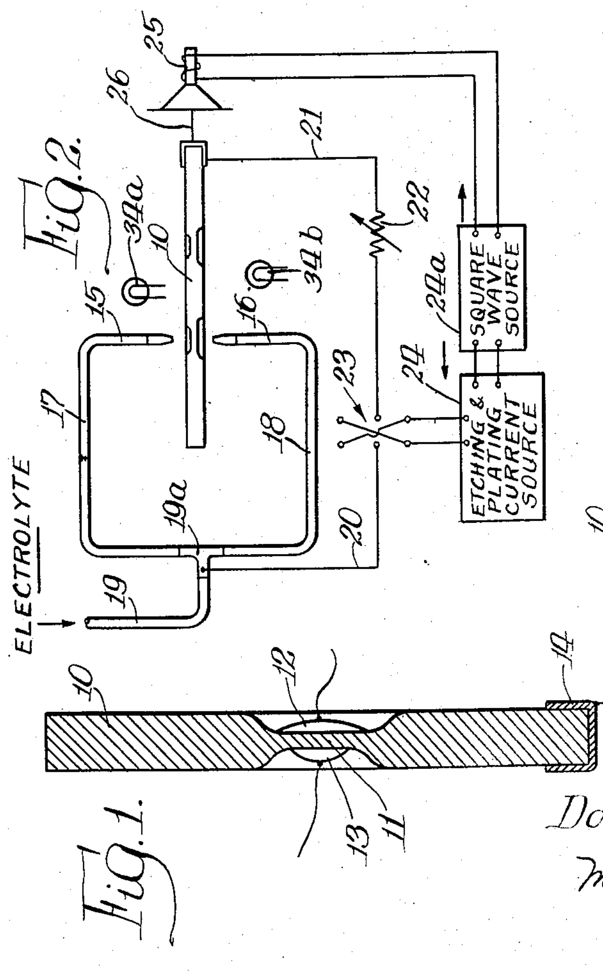
Fig. 1 is a schematic representation of a transistor fabricated in accordance with the surface barrier principles.
Fig. 2 shows schematically the formation of etched and plated cavities in a semiconductor crystal wafer in accordance with the invention.

The transistor of Fig. 1 includes a semiconductor crystal wafer 10 which is usually composed of n-type germanium although other semiconductor materials such as silicon can be used. The crystal wafer has a pair of etched cavities formed on opposite surfaces of the crystal and disposed directly opposite one another in coaxial relation. These cavities are separated by an extremely thin semiconductor crystal layer or wall 11 and have metal electrodes 12, 13 electroplated therein. Electrode 12, for example, forms the collector and electrode 13 the emitter of the transistor. A base electrode 14 is affixed to one end of the wafer 10, in known manner. As previously pointed out, it is essential for optimum performance characteristics that the cavities formed in the wafer 10 have relatively flat and parallel bottom surfaces so that the metal electrodes may be essentially parallel to one another, and that the separating wall or layer 11 be extremely thin.

Figure 1A:
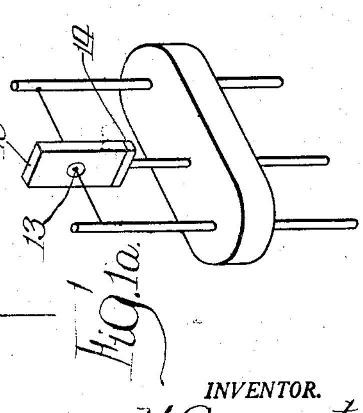
Fig. 1A is a perspective view of such a transistor supported on a base.

Fig. 1A shows the semiconductor 10 supported on a base by the various leads extending from the emitter, base and collector electrodes; the emitter and collector electrodes being formed thereon in a manner to be described.

Fig. 2 shows a means for forming satisfactory cavities in the crystal wafer in accordance with one embodiment of the invention. As shown in Fig. 2, the wafer 10 (whose size is greatly exaggerated for purposes of clarity) is supported in any known manner between a pair of opposing aligned nozzles 15, 16 directed at areas disposed on opposite sides of the wafer and preferably at the center thereof. Nozzles 15 and 16 are connected by glass tubes 17 and 18 to a common line 19 having a metal section **19*a*** and through which an electrolytic solution is passed. As previously noted, this electrolytic solution contains salts corresponding to the metal that is to form the plated electrodes, which, for example, may be indium.

An electric lead 20 is connected to the metal portion **19*a* of line 19 to establish electrical connection with the solution, and a lead 21 is electrically connected to the wafer 10. Leads 20 and 21 are connected through a variable resistor 22 to a pair of center contacts on a reversing switch 23. The reversing switch 23 is connected to a source 24 of etching and plating current, and which current is modulated by a square wave signal from source 24*a* in a manner to be described in detail. The square wave source 24*a* is also connected to an electro-mechanical transducer 25. Transducer 25 may be in the form of a speaker and will be described in more detail hereinafter. The transducer is mechanically connected to wafer 10 by a wire 26 so that energization of the transducer by the square wave from source 24*a* causes the wafer to move back and forth in a plane perpendicular to the axis of the jets from nozzles 15 and 16. When switch 23 is actuated so that current flows in the "etching" direction, and the jets are initiated, cavities are formed on the opposite sides of crystal 10. The etching current is modulated by the square wave from source 24*a* in synchronism with the reciprocating movement of crystal 10 by transducer 25**, so that two pairs of adjacent cavities are formed in the opposite faces. One of the pairs of cavities corresponds to the maximum amplitude value of the etching current with corresponding relatively high etching speed, and the other pair corresponds to the minimum value of the etching current with relatively low etching speed. In this manner, the etching in one of the pairs of cavities proceeds more rapidly than that in the other pair. It is possible, by terminating the etching process at the precise moment of breakthrough between the high etching speed cavities, to have the low etching speed cavities separated by an extremely thin region or layer of the crystal material of accurately controlled thickness.

As previously noted, the current flow through the semiconductor during the etching step is in the "back" direction, and a high ambient light is necessary to augment this flow. The high ambient light is provided by the light sources **34*a*, 34*b***. These light sources, for example, may be incandescent lights.

Figures 3, 6:
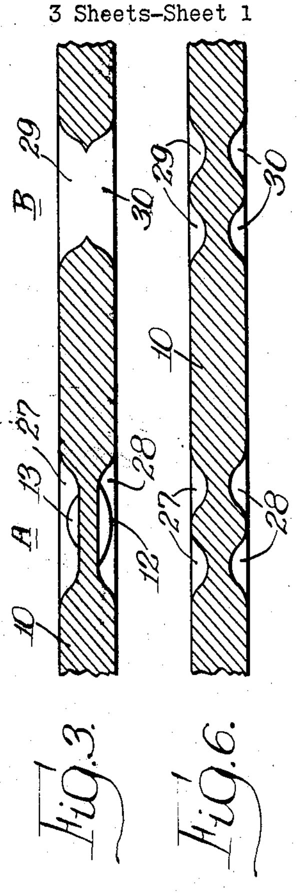
Fig. 3 is a fragmentary sectional view through a semiconductor crystal wafer assembly, processed in accordance with the present invention.

The etching process is terminated by reversing switch 23 which immediately initiates the plating process. Provision is made to de-energize square wave source **24*a* upon such reversal and to maintain crystal 10 with the centers of the low etching speed cavities disposed between the jets. This causes the plated electrodes 12 and 13 to be formed in the latter cavities. The resulting configuration is shown in Fig. 3, and this figure shows at A the plated electrodes 12 and 13 formed on the wafer 10 in the low etching speed cavities 27, 28, with the high etching speed cavities 29, 30 forming a pilot hole at B. As previously noted, it is desirable that the collector electrode be somewhat larger than the emitter electrode, and this may be achieved by making one of the nozzles 15, 16** slightly larger than the other.

Briefly, therefore, the method described above consists in imparting a low frequency (about 3 C. P. S.) reciprocal motion to the semiconductor wafer in a direction perpendicular to the axis of the jets during the etching process so that the semiconductor crystal is etched alternately at two positions spaced apart, for example, by about .015". At the same time, the etching current is modulated in phase with the motion of the wafer so that the etching current at one position is slightly higher (about 5%, for example) than the current in the other position. Thus, when the semiconductor is etched completely through at the higher current position, the remaining thickness of the semiconductor at the other position is extremely small. To be more specific, if W represents the original thickness of the wafer (assuming it to be the same at the two positions to be etched), w the remaining thickness of the wafer at the lower current position at the moment the wafer is etched completely through at the higher current position, $I_1$ the current at the lower current position, and $I_2$ the current at the higher current position, it can be shown that:

$$w=W\left(1-\frac{I_1}{I_2}\right)$$

provided that the etching times at the two positions are equal. For example, for $W=4$ mils and $I_1=0.95\ I_2$, $w=.2$ mil. Furthermore, the percent tolerance for w is the same as the percent tolerance for W.

In practice, the value of W will not be exactly the same at the two positions, the etching times will not be exactly the same at the two positions, and the current ratios will have a tolerance which must be taken into account. In order to minimize the error due to unequal etching times, the square wave motion imparted to the wafer by transducer 25 can be made extremely accurate by driving the transducer by an electronic apparatus in a manner to be described. In order to minimize the error due to the current ratio, a circuit has been devised and will be described herein which permits highly accurate control of this ratio with little or no adjustment. In order to minimize the error due to unequal values of W at the two positions, careful lapping and etching of the semiconductor wafer is required, and the two etching positions must be located very close to one another.

Figures 4, 5:
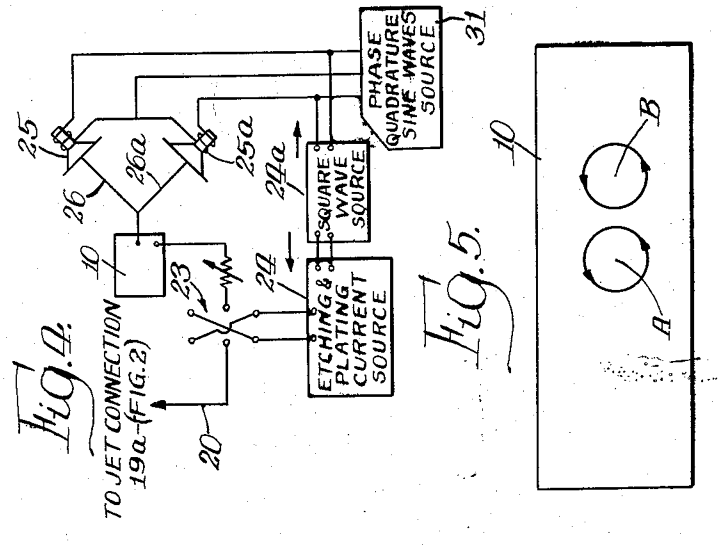
Fig. 4 shows a system for the the formation of etched and plated cavities in a semiconductor crystal wafer in accordance with a further embodiment of the invention.
Figs. 5 and 6 are diagrams illustrating the operation of the system of Fig. 4.

The invention thus far described has been found to solve one of the important problems discussed above. That is, it provides a simple and expedient process for etching the semiconductor wafer to provide an extremely thin base region with close tolerance between the electroplated electrodes for high power gain and high frequency response in the resulting transistor unit. The additional problem of forming the cavities so that the facing surfaces of the plated electrodes may be flat and essentially parallel may be solved by imparting a slight circular motion to the wafer in addition to the square wave motion. This additional motion causes the jets effectively to scan the cavities during the etching process. Both the reciprocal rectilinear motion produced by the square waves and the circular motions should be in a plane perpendicular to the axis of the jets, and this can be obtained by using a pair of electromechanical transducers mounted in space quadrature and fed with electric signals of proper amplitude and phase. Such arrangement is shown in Fig. 4 which is a view looking down on the semiconductor wafer from above. Two transducers 25, **25*a* are mounted in space quadrature and connected to the crystal 10 by rigid wires 26, 26*a*. The transducers are energized by the square wave signal from source 24*a*, and also by a pair of phase quadrature sine waves from source 31**.

The low-frequency square-wave signal from source **24*a* and the sine-wave signals (which have a relatively high frequency) are added electrically and fed to the voice coil of each transducer or speaker. The resultant motion of any point on the crystal wafer 10** will be as shown in Fig. 5. For example, if the low-frequency square-wave is 3 C. P. S. and the high frequency sine wave is 60 C. P. S., the point on the semiconductor under consideration will rotate in a circle at a position "A" with an angular velocity of 60 R. P. S. and for a duration of time equal to 1/6 sec. (or 1/2 the period of the low frequency square wave). The point will then jump to position "B" and execute a circle of the same diameter as the one at position "A." The point alternately performs a total of 10 revolutions at each position. The diameter of the circles can be easily set by adjusting the amplitude of the sine wave signals, and the distance between the circles can be easily set by adjusting the amplitude of the square-wave.

Therefore, when such complex motion is imparted to the germanium wafer relative to the jets, these jets effectively describe a circular scanning motion in the high etching speed cavities and in the low etching speed cavities. When the motion is such that the scanning is circular, as shown in Fig. 5, the shape of the etched cavities is as shown in cross section in Fig. 6. To obtain flat bottom cavities, it is only necessary to vary the diameter of the circles periodically in such a manner that each elemental area of the germanium in the cavities is etched the same length of time. Theoretically this calls for both frequency and amplitude modulation of the sine wave signals. It can be shown that the angular velocity $\omega$ should vary with time $t$ according to the relation:

$$\omega=K_1t^{-1/2}$$

and that the radius $r$ should vary with time according to the relation:

$$r=K_2t^{1/2}$$

where $K_1$ and $K_2$ are constants. In practice, however, it is sufficient to let $\omega$ be constant and alter the $r$ vs. $t$ curve so that the overlap of the jet stream causes an essentially flat bottom to be etched in each of the cavities. Any point on the germanium surface, therefore, executes a spiral motion with a constantly decreasing increase of radius with time. It is convenient to modulate the amplitude of the sine wave signals in phase with the square wave so that the diameter of the circle increases from zero to a maximum at each position "A" and "B." This synchronization is easily accomplished electronically, as will be shown hereinafter. Fig. 3 illustrates the resulting improvement in the flatness of the pit bottoms 27, 28.

To realize the ideal geometry of two parallel planar electrodes, the sine wave signals are terminated at the instant the etching current is reversed to initiate plating. (As previously noted the square wave is also terminated at this instant and the wafer is positioned with the low etch cavities between the jets.) Thus the electrodes are plated out in the exact center of the flat bottom pits or cavities. By using a large enough circular motion relative to the jet diameter, only the bottoms and not the sides of the cavities are plated, thus eliminating the need for drastic chemical etching of the plated region. That is, even though the sides of the cavities are dish-shaped, their increased radial dimensions due to scanning during the etching process, allows the jets to be directed to the center of a relatively large area during plating with the plated portion of each cavity extending only over a portion of the flat bottom surface.

In order to accomplish the various required operations automatically when the semiconductor etches completely through at the high etching speed pilot cavities, a light source is positioned on one side of the semi-conductor, and a photo tube is positioned on the other side to control an electronic system, in a manner to be described so that the etching is terminated and plating initiated the instant there is a breakthrough between the pilot cavities.

Figure 7:
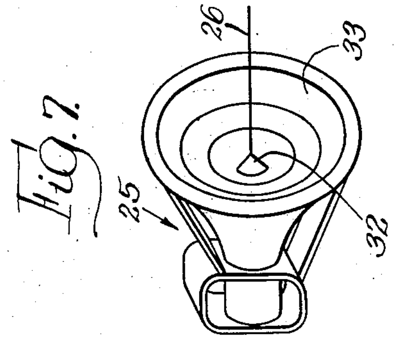
Figs. 7 and 8 show mechanical components of apparatus suitable for carrying out the process of the invention.
Figure 8:
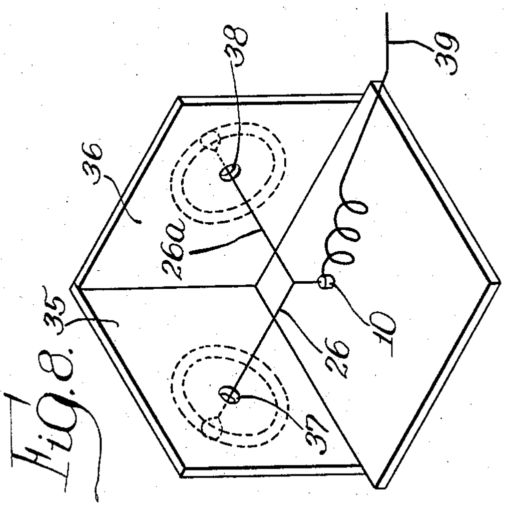

Various mechanical components for carrying out the process are shown in Figs. 7 and 8. As shown in Fig. 7, the electromechanical transducers 25, 25a may each be in the form of a loudspeaker having a thin metallic cone 32 cemented to its voice coil at the apex of the cone suspension 33. The small steel wire 26 is soldered to the cone and projects outwardly from the speaker a distance of 4 or 5 inches. Therefore, the passage of current through the voice coil produces rectilinear motion of the coil and of the wire 26 attached thereto.

As shown in Fig. 8, the transducers or speakers 25, 25a are rigidly mounted in space quadrature on a pair of vertical metallic plates 35, 36, the plates being disposed at right angles. Plates 35 and 36 have a pair of apertures 37, 38 respectively formed therein through which the steel wires 26, 26a from the cones on the speakers project. The size of the holes in the steel plates is chosen so as to provide critical or near critical damping to the motion of the steel wires. The semiconductor wafer 10 is attached to the junction of the wires in the manner shown. An electrical connection is made to the crystal by a thin flexible wire 39 corresponding to lead 21 in Figs. 2 and 4. The electrolytic apparatus is mounted to be associated with the crystal in the manner shown in Figs. 2 and 4.

A light source is provided, and light from that source is focused on the pilot cavity in crystal 10 by a suitable convergence lens. A photo tube is mounted on the opposite side of the crystal to receive light from the light source and control the system in a manner to be described. The mechanical arrangement for carrying out the process of the invention is illustrated and described herein in somewhat schematic form. However, it is believed that the actual physical relation of the various elements and methods for mounting those elements will readily suggest themselves to those skilled in the art, and that a detailed explanation of the actual mounting details of the mechanical and physical arrangement is unnecessary herein.

Figure 9:
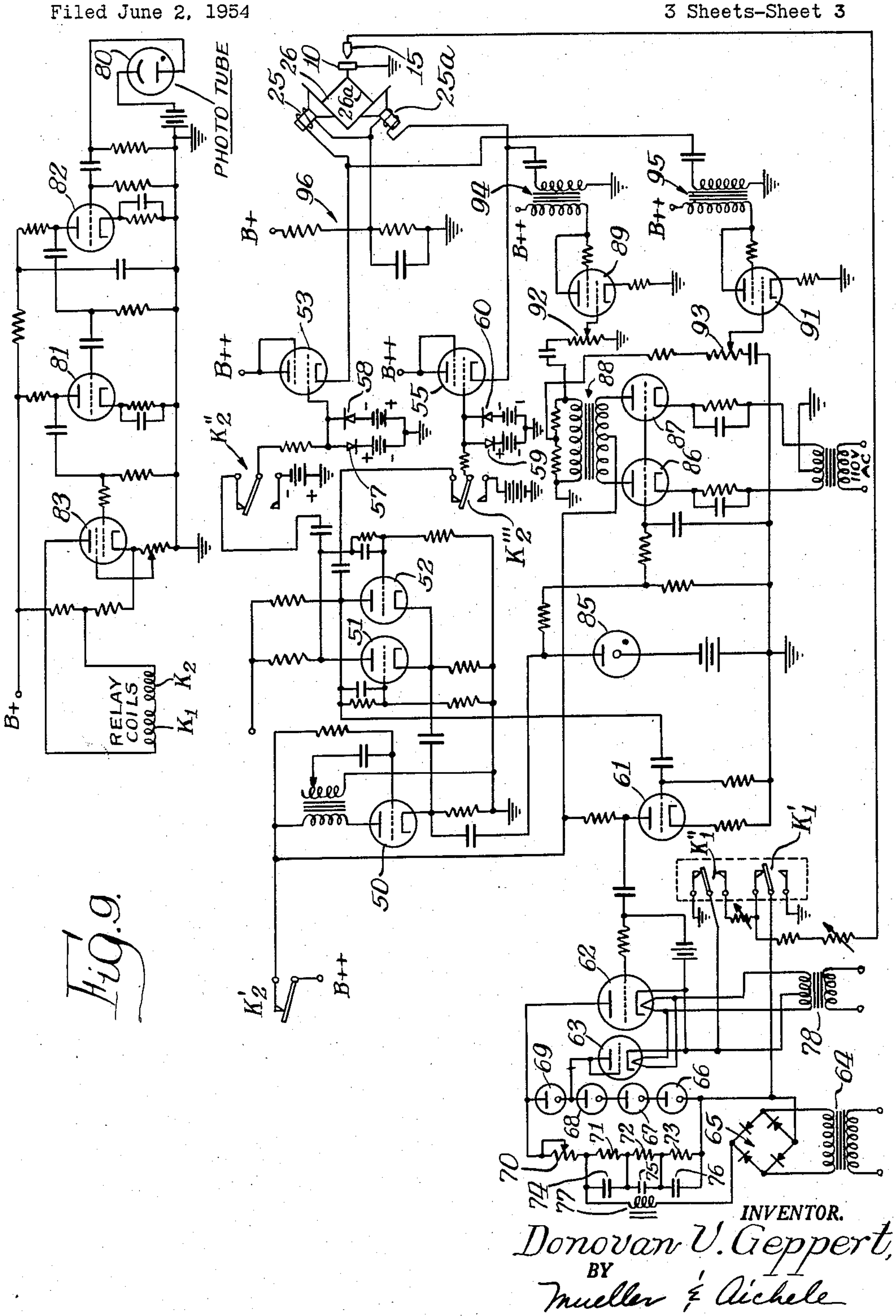
Fig. 9 is a detailed diagram of a suitable system for carrying out the improved process of the invention.

A detailed circuit for controlling the process described herein is illustrated in Fig. 9. The system of Fig. 9 includes an electron discharge device 50 which is connected in well-known manner to form a blocking oscillator. The cathode of device 50 is coupled to the cathodes of a pair of discharge devices 51, 52, the latter pair being connected to form a well-known Eccles-Jordan bi-stable trigger circuit. The anode of device 51 is coupled through a pair of normally closed contacts $K_2''$ to the control electrode of an electron discharge device 53. Device 53 is connected as a cathode follower driver stage, and its cathode is connected through the voice coil of the electromechanical transducer 25 to a tap on bleeder 96 connected between B+ and ground. The anode of device 52 is coupled through a pair of normally closed contacts $K_2'''$ to the control electrode of an electron discharge device 55. Device 55 is also connected as a cathode follower driver stage, and its cathode is connected to the tap on bleeder 96 through the voice coil of the electromechanical transducer 25a. The transducers 25 and 25a are mounted in space quadrature on members 35, 36 in the manner previously described, and mechanically coupled to the semiconductive wafer 10 by steel wires in the manner also described previously herein.

The blocking oscillator of device 50 is free-running, and it oscillates with a repetition rate of, for example, about 6 pulses per second. The blocking oscillator drives the bi-stable trigger circuit of devices 52, 52 and causes the trigger circuit to generate square waves at the anodes of the latter devices, these square waves having a repetition frequency (for example) of three cycles per second. The square waves from the bi-stable circuit are applied in phase opposition to the control electrodes of devices 53 and 55 so as to apply respective square wave control signals to the voice coils of transducers 25, 25a. As previously noted, the application of these control signals causes the transducers to move the semiconductor wafer in a direction perpendicular to the electrolytic jet from nozzle 15 between a first and a second position with respect to the jet. The blocking oscillator of device 50 has highly stable repetition characteristics so that the trigger circuit of devices 51, 52 is triggered at a constant repetition rate. This assures that the etching times at the two positions of the semiconductor wafer will be absolutely equal.

A pair of diodes 57, 58 are connected with opposite polarity between the control electrode of device 53 and respective sources of positive and negative potential. The purpose of these diodes is to function as clippers and insure a good flat-top square wave control signal to transducer 25. Diodes 59 and 60 are included in the circuit of the control electrode of device 55 for the same reason and to insure a good flat-top square wave control signal to transducer 25a. The circuits of diodes 57–60 provide positive control of the amplitude of the square wave signals so that the semiconductor wafer is moved to be precisely centered at each of its two positions and does not have a tendency to drift.

The anode of device 52 is also coupled to an electron discharge device 61, the latter being connected as an amplifier. The anode of device 61 is coupled to the control electrode of an electron discharge device 62. Electron discharge device 63 is connected as a diode. Devices 62 and 63 are connected in a power supply that supplies the etching and plating currents through the electrolytic jet and the semiconductor. Devices 62 and 63 function in a manner to be described to modulate the current through the jet in synchronism with the shift of the semiconductor by transducers 25, 25a. This establishes a high speed etching action at one position of the transducer and a low speed etching action at the other position of the transducer.

The power supply includes a power transformer 64 having a primary winding connected to the usual A. C. source, and having a secondary winding connected to a usual rectifier bridge 65. Bridge 65 is connected to a filter, which is connected to a series of ten 150 volt voltage regulator tubes and one 75 volt regulator tube 69. The aforementioned filter is comprised of filter choke 77 and capacitors 74, 75 and 76. The filaments of devices 62 and 63 are energized by the secondary winding of a filament transformer 78, the primary winding of this transformer being connected to the usual A. C. source. The cathodes of devices 62 and 63 are connected to a center tap on the secondary winding 78. Bridge 65 is connected through a normally closed contact $K_1'$ to nozzle 15 to establish electrical connection with the electrolytic jet, and the semiconductor wafer 10 is connected to ground.

Contact $K_1'$ is associated with a relay $K_1$. Relay $K_1$ also has a set of contacts $K_1''$, and when the relay is deenergized, contacts $K_1''$ connect the cathodes of devices 62 and 63 to ground, and contacts $K_1'$ connect bridge 65 to nozzle 15. This condition of relay $K_1$ establishes a current flow through the jet and the semiconductor in a direction to produce etching by the jet. When $K_1$ is energized, contacts $K_1''$ connect the cathodes of devices 62, 63 to nozzle 15, and contacts $K_1'$ connect bridge 65 to ground. This reverses the current flow through the jet and the semiconductor to produce electroplating. The control of relay $K_1$ will be described subsequently herein.

The square wave derived from the bi-stable trigger circuit of devices 51, 52 is amplified in device 61 and applied to device 62 so that the latter device may function as a modulator for the current supplied to the spray and semiconductor. The square wave drives device 62 between saturation and cutoff. When device 62 is driven to saturation, the plate-to-cathode voltage drop is only a few volts, and the diode-connected device 63 is cut off. Therefore, when device 62 is driven to saturation, the etching current flows through device 62 and has a relatively high value determined by the voltage drop across the entire bank of voltage regulator tubes 66–69. This voltage, for example, may be in the neighborhood of 1575 volts. When device 62, on the other hand, is driven to cutoff, device 63 is conductive and the current to the spray and semiconductor flows through device 63. The etching current now has a relatively lower value, and depends upon the voltage drop across the voltage regulator tubes 66–68 to the exclusion of the voltage drop across tube 69. This latter voltage drop across tubes 66–68 is of the order, for example, of 1500 volts. In the manner described above, the current through the jet and semiconductor is controlled to have a relatively high value when the semiconductor 10 is established in a first position by the square wave control signals applied to transducers 25, 25*a*; and to have a relatively lower value when the semiconductor is established in a second position by the square wave control signals applied to the transducers. The use of the voltage regulator tubes assures constant voltage at each of the modulated conditions, and this in turn assures a constant current ratio with good tolerance for the two etching positions of the semiconductor wafer.

As previously described, the current is maintained in the etching direction until the jets break through the semiconductor at the first or pilot position. At this time, due to the lower etching speed at the second position, a pair of opposite cavities are formed in the semiconductor at the second position with a thin wall of semiconductor material between the cavities.

As previously described, a photo-tube 80 is disposed adjacent the semiconductor to receive light when breakthrough at the first position of the semiconductor 10 occurs. The photo-tube transforms the light into electrical energy, and this energy is amplified by an amplifier including a pair of cascade-connected discharge devices 81, 82. The amplifier is constructed to amplify only alternating current signals, so as to be unresponsive to ambient light falling on the photo-tube. However, when break-through occurs, the light through the pilot hole is intermittently interrupted by the shifting of the semiconductor by transducers 25, 25*a*. This produces an alternating current square wave which is amplified by the amplifier of devices 81, 82 and applied to a thyratron discharge device 83. The application of the amplified square wave on device 83 fires that device and causes a current flow through the actuating coils of relays $K_1$ and $K_2$. The current flow through relay coil $K_1$ immediately reverses the current through the jet and semiconductor from the "etch" to the "electroplate" direction. Moreover, the current through the relay coil $K_2$ causes contact $K_2'$ to open to remove the energizing potential from the blocking oscillator of device 50 to terminate the production of the square wave control signal. Energization of coil $K_2$ also causes contacts $K_2''$ and $K_2'''$ to shift and establish the control electrode of device 53 at a fixed negative potential and the control electrode of device 55 at a fixed positive potential. This establishes fixed currents through the respective voice coils of transducers 25 and 25*a*, and maintains the semiconductor 10 in its second position for the plating operation with the jets being directed at the center of the cavities formed at this position.

A glow tube 85 is coupled to the blocking oscillator of device 50 to be actuated thereby, the glow tube being connected as a relaxation circuit for developing a series of periodic exponential waves in response to triggering by the blocking oscillator. The circuit of tube 85 is connected to the control electrodes of a pair of electron discharge devices 86, 87. These latter devices are connected as a balanced modulator, and the cathodes thereof are connected to the terminals of a center-tapped alternating current transformer, the center tap of which is grounded. The anodes of devices 86, 87 are connected in push-pull through a transformer 88, the primary winding of the transformer being connected to the anodes of the devices, and the center tap of the primary winding being connected to the positive terminal B++ through the normally closed contact $K_2'$. The secondary winding of transformer 88 is coupled to a pair of amplifiers including discharge devices 89 and 91. This coupling is made through a pair of resistance-capacity networks 92, 93 which respectively advance and retard the phase of the output signal from the balance modulator by 45° as applied to amplifiers 89, 91. Amplifier 89 is coupled through an output transformer 94 to the voice coil of transducer 25*a*, and amplifier 91 is coupled through a transformer 95 to the voice coil of transducer 25.

Figure 10:
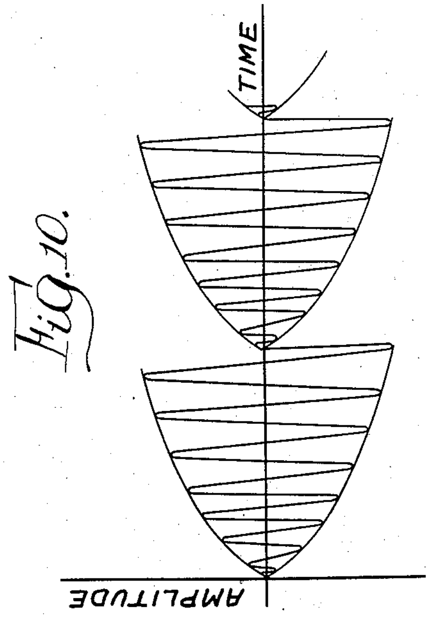
Figs. 10 and 11 are curves showing the waveforms of signals developed in the system of Fig. 9.

The spiral motion of wafer 10 discussed previously herein is produced by modulating the control electrodes of devices 86, 87 by the exponential signal of device 85. The exponential signal is a fairly good approximation to the desired modulation wave form. The high frequency sine wave signal (having a frequency of, for example, 60 C. P. S.) is fed to the cathodes of devices 86, 87 with a mutual 180° out-of-phase relation. The balanced modulator prevents any low frequency modulation components from appearing in its output circuit. The output signal from the secondary of transformer 88 thus appears as shown in Fig. 10. As previously noted, this output signal is connected through resistance-capacity phase shifting networks 92, 93 so that the control electrodes of amplifiers 89, 91 are driven in phase quadrature.

Figure 12:
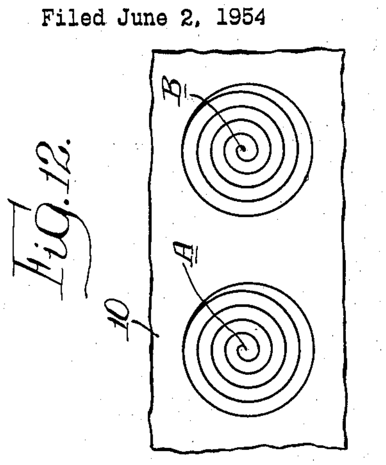
Fig. 12 is a diagram showing the motion produced on a semiconductor wafer by the system of Fig. 9.
Figure 11:
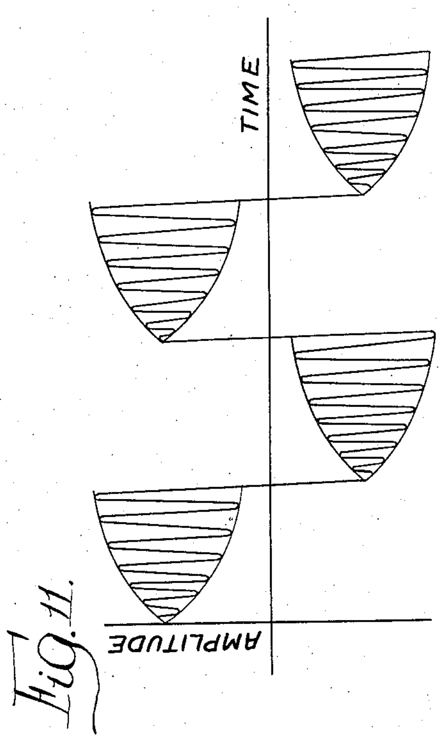

The resultant signal applied to the voice coils of transducers 25, 25*a*, is as shown in Fig. 11, this figure showing the composite wave formed by the square waves from devices 53, 55 and the exponentially varying sine waves from devices 89, 91. In the manner previously described, this wave form causes the semiconductor to shift from a first position A to a second position B recurrently, and in synchronism with the modulation of the current through the jet and semiconductor. In addition to this shifting, the modulated sine waves cause the jets effectively to scan a spiral path in each position to produce the desired flat bottom for the cavities. The path taken by any point on the germanium wafer as a result of these signals is shown in Fig. 12. Since the relaxation circuit of device 85 is triggered by the blocking oscillator circuit of device 50, the modulation of the sine-wave signals is synchronized with the square-wave control signals. Therefore, each shift of the semiconductor wafer and the commencement of each spiral scan by the jets occurs at the same time.

The invention provides, therefore, an improved method and apparatus for forming metallic electrodes on the opposite surfaces of a semiconductor wafer, with the electrodes being separated by an extremely thin wall of the semiconductor material. The process is rapid and efficient in its operation and may be fully automatic by using the system described in conjunction with Fig. 9. That system provides for the control of the etching current so that well-defined flat bottom cavities are formed in the opposite surfaces of the wafer. At the precise moment of breakthrough of the jets in the pilot hole, the etching current is reversed to produce the electroplating action, the semiconductor is returned and held in the proper position with the cavities disposed in the paths of the jets, and the signals previously applied to the transducers and to the current modulator are cut off.

The present process and apparatus enables clean, parallel, flat-bottomed cavities to be formed in the opposite surfaces of the semiconductor, and the control is such that these cavities can be formed to a depth wherein they are separated only by an extremely thin barrier or wall of the semiconductor material. This enables transistors having extremely high power gain and high frequency response to be constructed.

Moreover, the effective scanning action of the jets during the etching step produces cavities of larger radial dimensions than would otherwise be produced. The termination of the scanning action at the end of the etching step, with the jets being directed at the center of the cavities, enables the electrodes to be plated over the flat parallel bottoms of the cavities without completely filling the cavities. This assures that the electrodes will have flat parallel facing surfaces, without the necessity for a drastic chemical etching process.

While particular embodiments of the invention have been shown and described, modifications may be made, and it is intended in the appended claims to cover all such modifications as fall within the true spirit and scope of the invention.

I claim:

1. The method for etching a cavity in at least one surface of a semiconductor wafer which comprises, directing an electrolytic jet onto the surface of the wafer, passing an electric current through the jet and through the wafer to establish an etching action by the jet on the surface of the wafer, periodically varying the relative positions of said jet and said wafer with a reciprocal movement so that said jet is repeatedly directed to at least two distinct positions on the surface of the wafer for successive short periods of time, and etching away a predetermined amount of the wafer each time the jet is directed at one position and etching away a lesser amount of the wafer than said predetermined amount each time the jet is directed at the other position.

2. The method for etching a pair of opposing cavities in opposite surfaces of a semiconductor wafer which comprises, directing a pair of aligned opposing electrolytic jets onto the opposite surfaces of the wafer, passing an electric current through the wafer and the jets to establish etching actions by the jets on the respective surfaces of the wafer, periodically varying the relative positions of said jets and said wafer with a reciprocal movement along an axis perpendicular to the axis of said jets so that said jets are each repeatedly directed to two distinct positions on the respective surfaces of the wafer for successive short periods of time, etching at one rate at one of said positions, and etching at a rate different from said one rate at the other of said positions.

3. The method for etching a pair of opposing cavities in opposite surfaces of a semiconductor wafer which comprises, directing a pair of aligned opposing electrolytic jets onto the opposite surfaces of the wafer, passing an electric current through the jets and the wafer to establish etching actions by the jets on the respective opposite surfaces of the wafer, periodically varying the position of said wafer with a reciprocal movement transversely of the axis of said jets so that said jets are each repeatedly directed to two distinct positions on the respective opposite surfaces of the wafer for successive short periods of time, changing said electric current through said jets from a higher value in one of said positions to a lower value in the other of said positions to change the effectiveness of the etching action of said jets in said respective positions, and terminating the etching action of said jets upon breakthrough of opposing cavities formed thereby in one of said positions whereby opposing cavities are formed in the other of said positions separated by a wall of the semiconductor wafer having a predetermined thickness.

4. The method for etching a cavity in at least one surface of a semiconductor wafer which comprises, directing an electrolytic jet onto the surface of the wafer, passing an electric current through the jet and through the wafer to establish an etching action by the jet on the surface of the wafer, changing said electric current between different selected direct-current levels numerically greater than zero so as to control the speed of the etching action, and periodically varying the relative positions of the jet and the wafer with a reciprocal movement in synchronism with the change of said electric current to establish the etching action intermittently at different positions on the surface of the wafer and at different etching speeds at at least two of such positions.

5. The method for etching a cavity in at least one surface of a semiconductor wafer which comprises, directing an electrolytic jet onto the surface of the semiconductor, passing a unidirectional electric current of a selected direct-current level through the jet and through the semicondutor to establish an etching action by the jet on the semiconductor, periodically switching said electric current between a higher and a lower value by a rectangular wave to establish two selected speeds for the etching action, and periodically varying the relative positions of the jet and the semiconductor with a reciprocal movement in a direction perpendicular to the direction of the jet in synchronism with the switching of said electric current to establish the etching action intermittently at two different positions on the surface of the semiconductor and at different etching speeds for each such position.

6. The method for etching a pair of cavities on opposite sides of a semiconductor wafer, with the cavities being mutually separated by a thin wall of the semiconductor, which method comprises, directing aligned electrolytic jets onto the respective surfaces of the opposite sides of the semiconductor, passing a unidirectional electric current of a selected direct-current level through the jets and through the semiconductor to establish an etching action by the jets on the semiconductor, periodically switching said electric current between a higher and a lower value by a rectangular wave to establish two selected speeds for the etching action, and periodically shifting the semiconductor with a reciprocal movement in a direction perpendicular to the axis of the jets between a first and a second position in synchronism with the switching of said electric current to establish the etching action intermittently at said first and second positions and at different speeds for each of such positions.

7. The method for etching a pair of cavities on opposite sides of a semiconductor wafer, with the cavities being separated by a thin wall of the semiconductor, which method comprises, directing aligned electrolytic jets onto the respective surfaces of the opposite sides of the semiconductor, passing a unidirectional electric current of a selected direct-current level through the jets and through the semiconductor to establish an etching action by the jets on the semiconductor, modulating said electric current by a rectangular wave to establish a high and a low speed for the etching action, periodically shifting the semiconductor with a reciprocal movement in a direction perpendicular to the axis of the jets between a first and a second position in synchronism with the modulation of said electric current to establish intermittently high speed etching action at said first position and intermittently low speed etching action at said second position, and terminating said etching action upon breakthrough of said jets at said first position.

8. The method for etching a cavity in at least one surface of a semiconductor wafer, which comprises, directing an electrolytic jet onto the surface of the semiconductor, passing a unidirectional electric current of a selected direct-current level through the jet and through the semiconductor to establish an etching action by the jet on the semiconductor, varying said electric current between different selected direct-current levels numerically greater than zero so as to control the speed of the etching action, periodically varying the relative positions of the jet and the semiconductor with a reciprocal movement in synchronism with the variation of said electric current to establish the etching action at different positions on the surface of the semiconductor and at different etching speeds at at least two of such positions, and imparting a scanning motion between the jet and the semiconductor at at least one of such positions.

9. The method for etching a pair of cavities on opposite sides of a semiconductor wafer, with the cavities being separated by a thin wall of the semiconductor, which method comprises, directing opposing aligned electrolytic jets onto the respective surfaces of the opposite sides of the semiconductor, passing a unidirectional electric current of a selected direct-current level through the jets and through the semiconductor to establish an etching action by the jets on the semiconductor, periodically switching said electric current between a higher and a lower value by a rectangular wave to establish two selected speeds for the etching action, periodically shifting the semiconductor with a reciprocal movement in a direction perpendicular to the axis of the jets between a first and a second position in synchronism with the switching of said electric current to establish the etching action at said first and second positions and at different speeds for each of such positions, and imparting a recurrent spiral scanning motion between the jet and the semiconductor at at least one of such positions.

10. The method for etching a pair of cavities on opposite sides of a semiconductor wafer and for electroplating respective metallic electrodes in such cavities, with the metallic electrodes being separated by a thin wall of the semiconductor, which method comprises directing opposing aligned electrolytic jets of a metallic salt solution onto the respective surfaces of the opposite sides of the semiconductor, passing a unidirectional electric current of a selected direct-current level through the jets and through the semiconductor in a direction to establish an etching action by the jets on the semiconductor, modulating said electric current by a rectangular wave to establish a high and a low speed for the etching action, periodically shifting the semiconductor with a reciprocal movement in a direction perpendicular to the axis of the jets between a first and a second position in synchronism with the modulation of said electric current to establish the high speed etching action at said first position and the low speed etching action at said second position, and reversing the direction of said current upon breakthrough of said jets at said first position to deposit a metallic electrode by electroplating at said second position on each side of the semiconductor.

11. The method for etching a pair of cavities on opposite sides of a semiconductor wafer and for electroplating respective metallic electrodes in such cavities, with the metallic electrodes being separated by a thin wall of the semiconductor, which method comprises, directing opposing aligned electrolytic jets of a metallic salt solution onto the respective surfaces of the opposite sides of the semiconductor, passing a unidirectional electric current of a selected direct-current level through the jets and through the semiconductor in a direction to establish an etching action by the jets on the semiconductor, modulating said electric current by a rectangular wave to establish a high and a low speed for the etching action, periodically shifting the semiconductor in a direction perpendicular to the axis of the jets between a first and a second position in synchronism with the modulation of said electric current to establish the high speed etching action at said first position and the low speed etching action at said second position, imparting a recurrent spiral scanning motion between the jet and the semiconductor at said first and second positions, terminating the periodic shifting of the semiconductor and the scanning motion and returning the semiconductor to said second position upon breakthrough of said jets at said first position, and reversing the direction of said current upon such breakthrough to deposit a metallic electrode by electroplating at said second position on each side of the semiconductor.

12. Apparatus for etching a cavity in at least one surface of a semiconductor wafer, including in combination, a device for forming an electrolytic solution into a jet, mounting means for positioning the semiconductor in the path of the jet with a selected surface thereof facing the jet for impingement thereby, an electrical circuit connected to said device and to the semiconductor for establishing an electric current through the jet and semiconductor in a direction to establish an etching action between the jet and the semiconductor, a modulator in said electric circuit and responsive to an applied signal for modulating said electric current to control the speed of the etching action, actuating means coupled to said mounting means and responsive to an applied signal for periodically varying the relative positions of the jet and the semiconductor, and means for producing a periodic signal and for applying the same to said modulator and to said actuating means to establish the etching action at different positions on the surface of the semiconductor and at different etching speeds at at least two of such positions.

13. Apparatus for etching a cavity in at least one surface of a semiconductor wafer, including in combination, a device for forming an electrolytic solution into a jet, an electromechanical transducer mechanically coupled to the semiconductor wafer to position the wafer in the path of the jet with a selected surface of the wafer facing the jet for impingment thereby, and said transducer being responsive to an applied signal for shifting the wafer in a direction perpendicular to the axis of the jet, an electric circuit connected to said device and to the semiconductor for establishing an electric current through the jet and semiconductor in a direction to establish an etching action between the jet and the semiconductor, a modulator in said electric circuit and responsive to an applied signal for modulating said electric current to control the speed of the etching action, and means for producing an electrical signal having a rectangular wave shape and for applying the same to said modulator and to said electromechanical transducer to establish the etching action at two different positions on the surface of the semiconductor and at different etching speeds at each of such positions.

14. Apparatus defined in claim 13 in which said electromechanical transducer comprises a loud speaker having a voice coil movably mounted thereon for rectilinear motion in response to an applied signal, and a rigid wire mechanically coupled to said voice coil and extending along the axis of motion thereof to support the semiconductor at the end thereof remote from said voice coil.

15. Apparatus defined in claim 13 in which said electrical signal producing means comprises a free running blocking oscillator, and a bi-stable trigger circuit to said blocking oscillator and actuated thereby.

16. Apparatus for etching a pair of cavities on opposite sides of a semiconductor wafer and for electroplating respective metallic electrodes in such cavities, with the metallic electrodes being separated by a thin wall of the semiconductor, said apparatus including in combination, a device forming an electrolytic metallic salt solution into a pair of opposing aligned jets, an electromechanical transducer mechanically coupled to the semiconductor wafer to position the wafer in the paths of the jets with opposite surfaces of the wafer facing the respective jets for impingement thereby, and said transducer being responsive to an applied signal for shifting the wafer in a direction perpendicular to the axis of the jets, an electric circuit connected to said device and to the semiconductor for establishing an electric current through the jet and semiconductor in a direction to establish an etching action between the jet and the semiconductor, a modulator in said electric circuit and responsive to an applied signal for modulating said electric current to control the speed of the etching action, means for producing an electrical control signal having a rectangular wave shape and for applying the same to said modulator and to said electromechanical transducer to establish a high speed and a low speed for the etching action and to establish the low speed etching action at a first position of the semiconductor and the high speed etching action at a second position of the semiconductor and control means responsive to the breakthrough of said jets at said second position for reversing the direction of said current to deposit a metallic electrode by electroplating at said first position on each side of the semiconductor.

17. Apparatus defined in claim 16 in which said control means additionally terminates the production of said control signal, and applies a fixed potential to said transducer to maintain the semiconductor in said first position.

18. Apparatus defined in claim 16 in which said control means includes a photo tube, and a light source directed towards said photo tube through a point on the semiconductor that is brought into alignment with said photo tube when the semiconductor is in said second position.

19. Apparatus for etching a pair of cavities on opposite sides of a semiconductor wafer and for electroplating respective metallic electrodes in such cavities, with the metallic electrodes being separated by a thin wall of the semiconductor, said apparatus including in combination, a device for forming an electrolytic metallic salt solution into a pair of opposing aligned jets, a pair of electromechanical transducers mechanically coupled to the semiconductor wafer to position the wafer in the paths of the jets with opposite surfaces of the wafer facing the respective jets for impingement thereby, and said transducers being responsive to an applied signal for shifting the wafer perpendicular to the axis of the jets, means for mounting said transducers in space quadrature relation to provide rectilinear motion for the wafer along a pair of axes disposed at right angles to one another, an electric circuit connected to said device and to the semiconductor for establishing an electric current through the jet and semiconductor in a direction to esablish an etching action between the jet and the semiconductor, a modulator in said electric circuit and responsive to an applied signal for modulating said electric current to control the speed of the etching action, means for producing an electrical control signal having a rectangular waveshape and for applying the same to said modulator and to said electromechanical transducers to establish a high speed and a low speed for the etching action and to establish the low speed at a first position of the semiconductor and the high speed at a second position of the semiconductor, means for producing a periodic exponential wave synchronized with said control signal, a modulator for modulating a sine wave with said periodic exponential wave, said sine wave having a relatively high frequency compared with said control signal, a network for applying the modulated sine wave from said last named modulator to said respective transducers in phase quadrature relation, and control means responsive to the breakthrough of said jets at said second position for reversing the direction of said current to deposit a metallic electrode by electroplating at said first position on each side of the semiconductor.

20. The method of etching a cavity in a semiconductor wafer which includes, directing an electrolytic jet onto the surface of the wafer, passing an electric current through the jet and through the wafer to establish an etching action by the jet on the surface of the wafer, periodically varying the relative positions of said jet and said wafer in a reciprocal motion so that said jet is intermittently directed to two alternate positions on the surface of the wafer to etch progressively two adjacent cavities therein, and stopping the etching action of the jet when the jet first breaks through the wall of one of said cavities.

21. The method of etching a cavity having an essentially flat bottom of a predetermined area in a surface of a semiconductor wafer which method includes the steps of directing an electrolytic jet onto the surface of the wafer, the jet having a smaller cross-sectional area than the area of the bottom of the cavity, applying an electric current through the jet and the wafer to establish an etching action by the jet and imparting a spiral scanning motion between the jet and the wafer with constantly decreasing increase of radius of the spiral.

References Cited in the file of this patent

UNITED STATES PATENTS

| | | |
|---|---|---|
| 1,416,929 | Bailey | May 23, 1922 |
| 2,721,834 | Koury | Oct. 25, 1955 |
| 2,744,860 | Rines | May 8, 1956 |
| 2,746,918 | Whittington | May 22, 1956 |

OTHER REFERENCES

"Proceedings of The Institute of Radio Engineers," December 1953, vol. 41, No. 12, pages 1706 thru 1708; article by Tiley et al.